United States Patent [19]
Hibbs

[11] Patent Number: 6,096,458
[45] Date of Patent: Aug. 1, 2000

[54] METHODS FOR MANUFACTURING PHOTOLITHOGRAPHY MASKS UTILIZING INTERFERING BEAMS OF RADIATION

[75] Inventor: Michael Straight Hibbs, Westford, Vt.

[73] Assignee: International Business Machines Corporation, Armonk, N.Y.

[21] Appl. No.: 09/129,297

[22] Filed: Aug. 5, 1998

[51] Int. Cl.[7] .................................................. G03F 9/00
[52] U.S. Cl. .................................................................. 430/5
[58] Field of Search ........................... 430/5, 270.1, 942, 430/945, 296

[56] References Cited

U.S. PATENT DOCUMENTS

| | | | |
|---|---|---|---|
| 3,615,449 | 10/1971 | Greenaway | 96/35 |
| 5,135,609 | 8/1992 | Pease et al. | 156/654 |
| 5,246,800 | 9/1993 | Muray | 430/5 |
| 5,360,764 | 11/1994 | Celotta et al. | 437/173 |
| 5,446,587 | 8/1995 | Kang et al. | 359/562 |
| 5,527,645 | 6/1996 | Pati et al. | 430/5 |
| 5,705,320 | 1/1998 | Hsu et al. | 430/313 |
| 5,776,660 | 7/1998 | Hakey et al. | 430/296 |
| 5,840,451 | 11/1998 | Moore et al. | 430/30 |
| 5,882,977 | 3/1999 | Dunn et al. | 438/353 |
| 5,932,394 | 8/1999 | Van Hunsel et al. | 430/302 |

FOREIGN PATENT DOCUMENTS

| | | |
|---|---|---|
| 3632999 | 3/1988 | Germany . |
| 60-216304 | 10/1985 | Japan . |

*Primary Examiner*—Christopher G. Young
*Assistant Examiner*—Saleha R. Mohamedulla
*Attorney, Agent, or Firm*—Pollock, Vande Sande & Amernick; William D. Sabo

[57] ABSTRACT

A method for manufacturing a photolithography mask. At least two interfering beams of radiation are utilized to define a grid of dividing lines corresponding to an interference pattern produced by the interfering beams on a surface of a photolithography mask coated with a mask film.

30 Claims, 1 Drawing Sheet

METHODS FOR MANUFACTURING PHOTOLITHOGRAPHY MASKS UTILIZING INTERFERING BEAMS OF RADIATION

FIELD OF THE INVENTION

The present invention relates to the field of masks utilized in photolithography processes employed in semiconductor device manufacture. In particular, the present invention relates to methods for defining a set of grid lines in a masking material present on a photolithography mask. The present invention also relates to photolithography mask and a device for making a photolithography mask.

BACKGROUND OF THE INVENTION

As integrated circuit fabrication techniques become more sophisticated, feature sizes become increasingly smaller. According to typical techniques, manufacturing integrated circuits may require the use of several overlapping layers of masks that must be precisely positioned relative to each other to form desired structures. The positional accuracy of placement of the features on each integrated circuit mask may also be extremely important.

To make masks acceptable for use in manufacture of integrated circuits that meet state of the art standards, especially the positional accuracy requirements, some prior art systems utilize scanning electron beam pattern generators. Such state of the art devices typically employ interferometers to precisely position the workpiece supporting the photolithography mask blank and scan the workpiece with an electron beam in raster fashion. The electron beam is turned on and off to expose an electron sensitive photoresist layer over a layer of chromium so as to define the size, shape, and position of the features to be fabricated.

Such electron beam pattern generators are very expensive. Further, they must be employed in precisely controlled environments where temperature and humidity are controlled to very tight tolerances. Typically, temperature must be controlled to plus or minus 0.1° C. Particulates in the air must also be eliminated or substantially reduced. Such operational environments are very expensive to build and maintain.

Integrated circuits, often referred to as chips or dies, are designed for many different purposes. The number of integrated circuits built depends upon the application of which the chip is designed. For example, in the case of a memory chip, millions may be built whereas an exotic microwave integrated circuit may have only a few hundred built. The microwave chip will, however, require the same or greater precision in feature size and positional accuracy as the memory chip. Since the cost to make a chip is related to the number made, it is apparent that making chips that require state of the art feature sizes and positional accuracy becomes impractical when a low volume of chips are to be made.

More generally, a large market exists for low volume, application specific integrated circuits (ASICs), many of which require state of the art circuit feature sizes and positional accuracy.

Typical integrated circuit processing systems may utilize 4x or 5x reticles or masks. This means that the feature sizes on the mask will be reduced in size by a factor of four or five during projection of the mask image on the die.

Although the use of 4x, 5x or other factor reduction lithography allows a somewhat relaxed tolerance for mask dimensions and feature placement, the mask is only allowed to contribute a small fraction of the total dimensional and positional error of the features printed on the semiconductor chip. As these tolerances decrease from year to year, it becomes increasingly difficult for electron beam pattern generated to meet the accuracy requirements placed on them.

U.S. Pat. No. 5,135,609, issued Aug. 4, 1992, to Pease et al., and assigned to The Board of Trustees of Leland Stanford Junior University, the entire disclosure of which is hereby incorporated by reference, provides one solution to the above-discussed problems. Pease et al. present what they refer to as a "quantum lithography mask" that includes a precisely created grid of lines separating tiles of mask material. Selected tiles may be removed to create a desired pattern in the mask to result in a desired pattern of exposure to a substrate. The tiles of masking material are processed so as to completely remove selected tiles, while leaving the remaining tiles with their edge intact. Thus, the dimensional and positional accuracy of the final pattern may be determined only by the accuracy of the tile and grid pattern generated on the mask substrate before the final patterning is performed.

SUMMARY OF THE PRESENT INVENTION

Although Pease et al. describe their "quantum mask" solution, they fail to disclose practical, cost effective methods for manufacturing the tile and grid pattern required.

It is an object of the present invention to provide methods for manufacturing tile and grid substrates for microlithography masks.

Aspects of the present invention provide a method for manufacturing a tile and grid substrate for a photolithography mask. The method includes utilizing at least two interfering beams of radiation to define a grid of dividing lines corresponding to an interference pattern produced by the interfering beams on a surface of a photolithography mask coated with a photoresist film.

Additional aspects of the present invention provide a tile and grid substrate for a microlithography mask made by a method including the step of utilizing at least two interfering beams of radiation to define a grid of dividing lines corresponding to an interference pattern produced by the interfering beams on a surface of a photolithography mask coated with a photoresist film.

Further aspects of the present invention provide a device for making tile and grid microlithography masks. The device includes at least two interfering beams of radiation arranged to define a grid of dividing lines corresponding to an interference pattern produced by the interfering beams on a surface of a photolithography mask coated with a photoresist film.

Still further aspects of the present invention provide a method for manufacturing a tile and grid photolithography mask. The method includes utilizing conventional photolithography techniques to define a grid of dividing lines corresponding to an interference pattern produced by the interfering beams on a surface of a master photolithography mask coated with a film of a masking material.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention.

Accordingly, the drawings and description are to be regarded as illustrative in nature and not as restrictive.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

The method that Pease et al. discloses for forming a photolithography mask, in summary, includes providing an optically transparent mask, such as a glass mask. A coating of a masking material, typically chromium is deposited on the mask. The chromium masking material is then patterned to produce a grid of small tiles, separated by thin lines where the chromium is removed.

Figure 1:
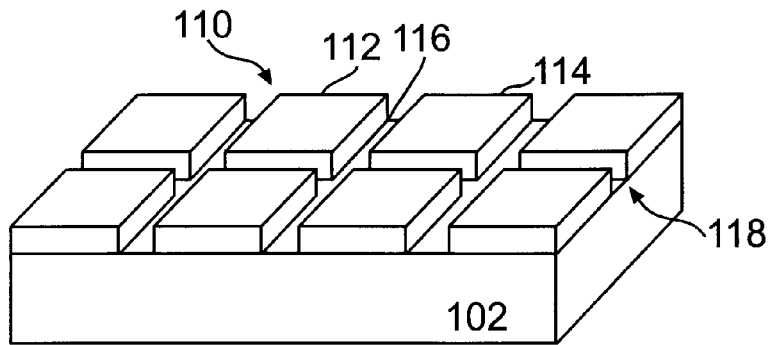
FIG. 1 represents an embodiment of a photomask blank according to the present invention, the includes a grid pattern separating tiles of a mask material.

FIG. 1 illustrates an example of such a mask. The mask shown in FIG. 1 includes a transparent substrate 102, such as a quartz plate. Tiles 112 and 114, for example, have been formed on the substrate 102. Lines 116 and 118, for example, have been formed by removing masking material that formerly coated the entire substrate 102. Removal of the masking material generates lines 116 and 118, defining tiles 112 and 114. The structure represented in FIG. 1 can be considered a mask blank 110. Selected tiles may be removed to generate a mask to produce a desired exposure patter on, for example, a semiconductor substrate.

According to one method, a layer of photoresist is deposited on the masking material. Next, the photoresist is exposed to appropriate radiation using a direct-write patterning device such as an electron beam pattern generator. After exposure, the photoresist is developed, exposing the grid pattern in the masking material. Then, the masking material is etched to remove the masking material in the grid pattern. The photoresist may then be removed.

Additional steps may be carried out to remove one or more of the "tile" members so as to result in a desired mask pattern to produce a desired exposure of a substrate.

Although Pease et al. disclose a photolithography mask and a method for producing the photomask, the method is not practical, particularly cost wise, for large scale manufacturing of the photomask. This is because the electron beam pattern generator used for creating the fine grid of lines is not expected to be cheaper or faster or more accurate than the pattern generators presently used to directly write a photomask pattern. Other problems associated with the method disclosed by Pease et al. include the extreme difficulty in generating a defect-free, extremely fine pitched grid on the photomask. Another problem associate with the photomask and method disclosed by Pease et al. is the requirement that the final photomask pattern be made on a discrete grid that may be large compared to the usual design grid due to the practical difficulties of making a very small physical grid. Furthermore, the physical cracks, or the grid of lines, separating the tile portions may produce rough edges of the images projected through the lithographic exposure system in which the mask is utilized.

As stated above, the present invention provides methods for manufacturing microlithography masks, including those disclosed by Pease et al. According to one embodiment, the present invention creates a holographic diffraction grating on a mask by projecting at least two beams of radiation on to the surface of the mask such that the radiation produced by one beam interferes with radiation produced by another beam to produce a series of parallel lines. The beams of radiation may be generated by a single radiation source.

One advantage of a method according to the present invention is that the grid lines may be produced more quickly and less expensively than other methods, such as utilizing an electron beam to write the grid lines. Additionally, such a method may provide better line width control and positional accuracy than direct writing techniques.

The beams of radiation may be derived from a source of highly uniform, coherent radiation, such as a laser. The wavelength and other characteristics of the radiation beams may depend upon the task to be accomplished by the radiation. For example, if photoresist is being exposed by the interfering beams of radiation, then the radiation preferably includes radiation having a wavelength that the photoresist is sensitive to.

Utilizing two interfering beams of radiation, the separation between the lines of the interference pattern projected on the photomask is a function of the wavelength of the radiation and the angle between the two beams. Typically, the smallest pitch or spacing between the lines that can be achieved is about one-half of the wavelength of the radiation utilized for the exposure. For example, an embodiment utilizing a radiation source that includes two excimer laser beams producing radiation with a wavelength of about 193 nm interfering at an angle of 75° from normal incidence would produce an interference pattern with a pitch of approximately 100 nm.

Among the parameters of the grid that may be controlled by altering certain aspect of the process include the shape of the tiles. For example, the tiles could be formed in a cartesian coordinate system, resulting in rectangular tiles.

If a cartesian coordinate system is being utilized, the grid may be produced by the interference pattern by sequentially exposing and etching the grid in the x and y axes to create a square, or rectangular grid. The tiles formed in the masking material could have any desired length and width, depending upon how the photoresist is exposed. For example, the tiles could be square, with a length and width of about 100 nm. Of course, the exposure of the photoresist could be carried out to result in any desired size of tiles being produced in the underlying masking material.

The size of the tiles basically makes a very high level of control possible when utilizing a mask produced according to the present invention. The individual tiles basically function as pixels. As individual tiles are removed in the mask production process, any desired masking pattern can be produced in the mask.

The size of the grid lines could also be varied. Typically, the grid lines are sufficiently small so as not to result in enough radiation passing through them during subsequent use of the mask so as to result in undesired exposure of a substrate. According to one example that includes an approximately 100 $\mu$m grid, spaces between tiles should be as small as possible. According to one embodiment, the spaces between tiles are about 20 nm or less.

Dimensional accuracy of the grid squares can be determined by the dose and process uniformity over the mask blank, the mask entirely covered by the photoresist material. On the other hand, the positional accuracy of the grid lines may be determined by the wave front errors of the radiation beams being utilized. For example, across-plate accuracy of about 10 nm could be achieved if the wave fronts have errors of less than one-tenth of the wavelength. Similarly, across-plate accuracy of about 1 nm could be achieved if the wave fronts have errors of less than one-hundredth of the wavelength. Such wave front accuracies are possible utilizing currently available technologies.

According to the present invention, the photoresist used to coat the masking material may be exposed in other manners. For example, the grid could be generated by utilizing conventional reduction lithography techniques. According to such a technique, a master grid could be made on a mask at four times the final grid dimension utilizing conventional mask making techniques.

The mask including the master grid could then be utilized to expose a second mask blank on a 4x reduction stepper. The master grid mask could be stepped across the entire surface of the new mask blank. According to such an embodiment, any dimensional and/or image placement errors in the master grid will be reduced by the 4x demagnification of the stepper. Even if the stepper introduced other dimensional and/or image placement errors, the net error on the grid will be less than if it were directly generated by an electron beam mask writer.

Utilizing currently available technology, the smallest grid that can be generated by conventional lithography would have a pitch of about 400 nm. Utilizing dipole illumination or a chromeless phase shift mask, currently available technology could achieve a grid pitch of about 200 nm or less. Furthermore, utilizing hybrid photoresist or a side-wall image transfer technique, both of which are described below in greater detail, the grid pitch could be reduced to about 100 nm utilizing conventional photolithography techniques.

As referred to above, the type of photoresist utilized in the grid formation process could be altered. According to one example, a hybrid of positive and negative photoresist could be utilized. Hybrid photoresists are disclosed in U.S. patent application Ser. No. 08/715,287, filed Sep. 16, 1996, to Hakey et al.; U.S. patent application Ser. No. 08/715,288, filed Sep. 16, 1996, to Hakey et al.; and U.S. patent application filed Oct. 29, 1997, entitled "Method for Forming Features Using Frequency Doubling Hybrid Resist and Device Formed Thereby", having attorney docket number BU9-96-099, to Furukawa et al., all of which are assigned to International Business Machines Corporation, the assignee of this application, and the entire contents of which are all incorporated herein by reference.

Hybrid photoresist or photoresist which is sensitive to intermediate intensity radiation. In other words, if radiation utilized in a photolithography system includes a continuum of intensities, the fringes, at the lowest intensity and the central area, of greatest intensity, will not expose hybrid resist. This resist response is an expression of the unique dissolution rate properties of a hybrid resist, in which unexposed resist does not develop, partially exposed resist develops at a high rate, and highly exposed resist does not develop.

Typically, only the areas of intermediate intensity in between will expose the resist and may then be developed. These areas of the hybrid resist exposed tend to be very narrow. As a result of these properties, hybrid photoresist can act as a "frequency doubling" resist, giving two lines for every one exposed since two areas of intermediate intensity will be exposed for each line of radiation directed at the hybrid resist. In other words, the unique dissolution rate response of the hybrid photoresist allows a single aerial image to be printed as a space/line/space combination rather than as a single line or space, as with conventional resist. This "frequency doubling" capability of this resist allows conventional expose systems to be extended to higher pattern densities.

An embodiment utilizing hybrid photoresist could employ a similar optical arrangement as described above, with the interfering beams of radiation. An embodiment utilizing the hybrid photoresist and the optical arrangement could produce a grid having a pitch of about one-quarter the wavelength of the radiation utilized in the exposure. In other words, the grid pitch could be about 50 nm if a wavelength of about 193 nm is utilized.

After exposure, the photoresist may be developed. Further enhancement or alteration of the above-described processes can occur after development of the photoresist coating the masking material. For example, after development of the photoresist, a biasing technique could be utilized to reduce the size of the grid openings in the photoresist.

Along these lines, a material could be deposited on the walls of the grid openings to reduce their size. According to one such embodiment, a material is first conformally deposited over the photoresist and the grid openings formed therein. A portion of the material could be removed, leaving a sort of spacer on all of the side walls of the grid openings.

According to one embodiment, the photoresist is coated with a silicon oxide layer. The oxide layer could be a conformal coating. One example of an oxide that could be utilized to coat the photoresist is tetraethylorthosilicate (TEOS) oxide layer. After deposition, the oxide layer may be etched to form the spacers on the side walls of the grid. According to one embodiment, the oxide layer is anisotropically etched. The above treatment of the grid lines can result in the formation of gridline openings of a desired width between the tiles between the grid lines.

Other edge transfer processes could also be utilized according to the present invention. For example, a side wall image transfer (SIT) process could utilized to convert the grating pattern to a pitch-doubled grating with very thin grid lines between the tiles of masking material. According to one embodiment of an SIT process, the layer of photoresist with the grid created therein could be coated with a thin conformal coating of TEOS oxide. The oxide may then be etched back, for example, anisotropically. After etching, the remaining structure includes grid lines that have a thin oxide spacer deposited on their side walls. The photoresist may then be removed, leaving the spacers free standing.

After removal of the photoresist, a layer of another material may be deposited over the array of spacers. One example of such a material is polycrystalline silicon. The material may then be planarized. One process that may be utilized to planarize the additional material is chemical-mechanical polishing. The planarization may be carried out until the spacers are exposed. The spacers may then be removed, for example, by a selective etch. The chrome exposed by the removal of the spacers may then be etched, leaving the tiles of masking material with the grid lines between them. Such a process can result in the formation of grid lines having a pitch of about 50 nm.

After exposure of the grid lines and possible edge or side wall treatment, the masking material may be etched to remove masking material in a pattern of the grid lines. As described by Pease et al., after definition of the grid in the masking material, the masking material and grid may be covered with another layer of photoresist. At least a portion of photoresist over one or more tiles that are to be removed may be exposed. The photoresist may then be developed, exposing at least a portion of the underlying tile of masking material. The masking material may then be overetched, thereby removing the masking material up to the edge of each tile exposed to the etching solution.

After the tiled substrate is patterned by selectively removing some of the tiles, the grid lines between the remaining tiles can be filled, thus "healing" the undesirable cracks in the final pattern. The photoresist can then entirely removed. Cracks between the chrome tiles could be "healed". The healing may take be carried out with a variety of processes. For example, an opaque material, such as metal, could be conformally deposited on the masking material. The opaque material could then be anisotropic etched back until is flush with the surface of the masking material.

Such a process effectively generates side wall spacers on the walls of the tiles bounding the grid lines, wherein the spacers are sufficiently thick to fill the grid lines, which are relatively uniformly thick, between the tiles of masking material. For a mask where tiles having dimensions of about 40 nm, with a gap of about 10 nm between blocks, the space should be relatively easy to fill.

The present invention also includes a mask formed according to the processes described above.

Figure 2:
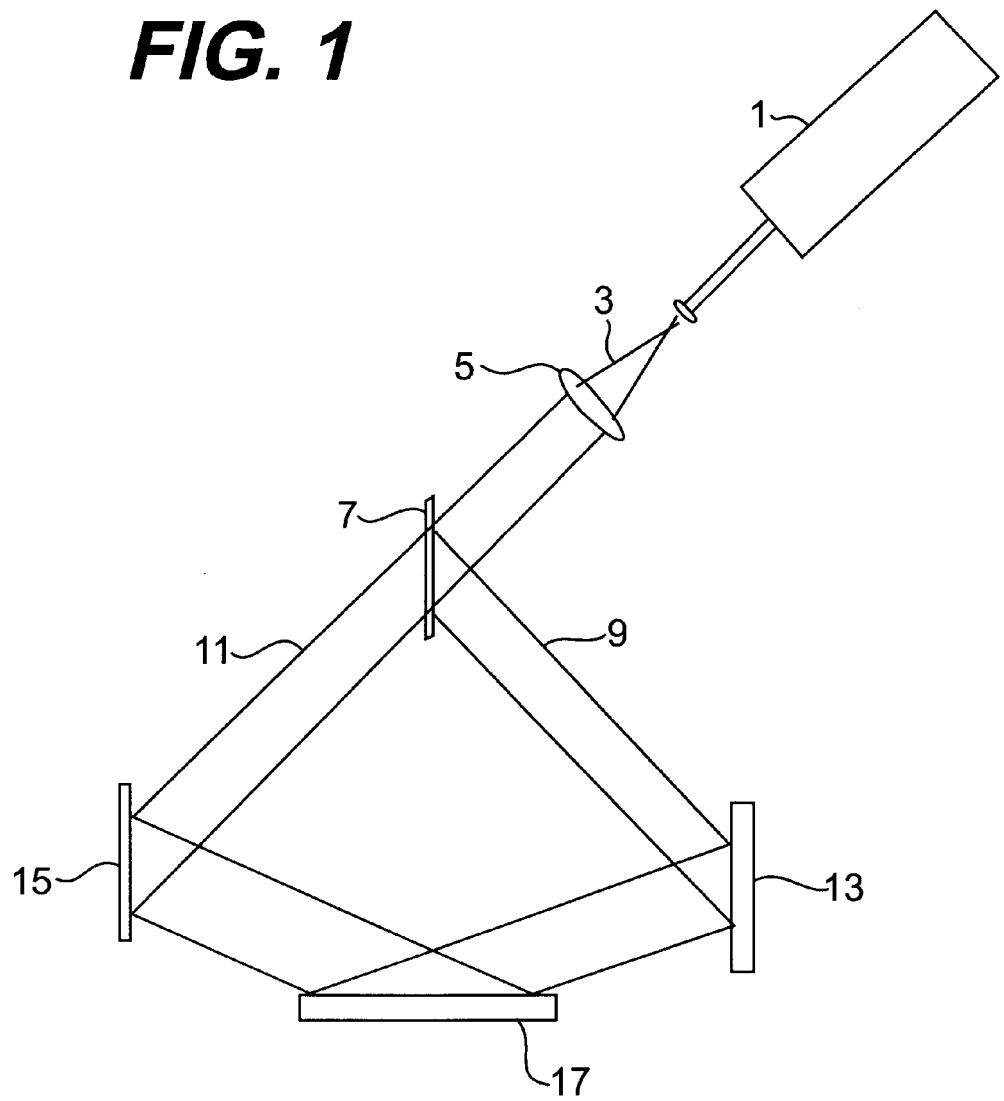
FIG. 2 represents an embodiment of an apparatus according to the present invention that may be utilized to carry out a process according to the present invention.

Additionally, the present invention includes an apparatus for forming such masks. FIG. 2 illustrates an embodiment of a device according to the present invention. the embodiment illustrated in FIG. 2 includes a radiation source 1 that generates radiation 3. One example of a radiation source is a laser. The apparatus may include one or more lenses for altering the radiation. The embodiment illustrated in FIG. 2 includes a lens 5 that acts as a beam expander. Too generate the two interfering beams of radiation, the radiation 3 may be split into two beams by beam splitter 7. The beams 9 and 11. Beams 9 and 11 may be redirected toward a photomask substrate 17 to be exposed by reflecting surfaces 13 and 15.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

I claim:

1. A method for manufacturing a photolithography mask, the method comprising the step of:
utilizing at least two interfering beams of radiation to define a grid of dividing lines corresponding to an interference pattern produced by the interfering beams on a surface of a photolithography mask coated with a mask film, the grid of dividing lines defining a plurality of tile portions in the mask film.

2. The method according to claim 1, further comprising the step of:
selectively removing at least one of the tile portions of the mask film.

3. The method according to claim 1, further comprising the steps of:
coating the mask film with a layer of photoresist, the interfering beams defining the grid of dividing lines in the layer of photoresist;
developing the layer of photoresist to produce openings in the layer of photoresist corresponding to the grid of dividing lines; and
etching portions of the mask film exposed by developing the photoresist.

4. The method according to claim 3, further comprising the step of:
reducing the size of the openings in the layer of photoresist prior to etching the mask film.

5. The method according to claim 4, wherein reducing the size of the openings in the layer of photoresist comprises the steps of:
coating the photoresist with a layer of a material; and
etching the material layer, leaving side walls on the openings in the layer of photoresist.

6. The method according to claim 5, wherein the material layer is an oxide layer.

7. The method according to claim 6, wherein the oxide layer is a conformal coating of a tetraethylorthosilicate oxide layer and wherein the oxide layer is anisotropically etched.

8. The method according to claim 1, wherein the dividing lines in the mask film are about 100 nm wide or less.

9. The method according to claim 1, wherein the pitch of the grid of lines is about one-half of the wavelength of radiation of the interfering beams or less.

10. The method according to claim 3, wherein the pitch of the grid of lines is about one-quarter of the wavelength of radiation of the interfering beams or less.

11. The method according to claim 10, wherein the photoresist is a positive/negative hybrid photoresist.

12. The method according to claim 1, wherein the radiation has a wavelength of about 193 nm or less.

13. The method according to claim 1, further comprising the steps of:
coating the mask film with a layer of photoresist, the interfering beams defining the grid of dividing lines in the layer of photoresist;
developing the layer of photoresist to produce openings in the layer of photoresist corresponding to the grid of dividing lines;
coating the developed layer of photoresist with an oxide layer;
etching the oxide layer so as to leave spacers of the oxide on the walls of the grid openings in the layer of photoresist;
selectively removing the photoresist, thereby leaving the oxide spacers;
depositing a layer of material over the spacers;
planarizing the layer of material for a time sufficient to expose the spacers; and
removing the spacers.

14. The method according to claim 13, further comprising the step of:
etching the mask film.

15. The method according to claim 13, wherein the oxide layer is a conformal coating of a tetraethylorthosilicate oxide layer and wherein the oxide layer is anisotropically etched.

16. The method according to claim 13, wherein the layer of material is polycrystalline silicon.

17. The method according to claim 13, wherein the planarization is accomplished with chemical-mechanical polishing.

18. The method according to claim 1, wherein the tile portions have a length and a width of about 100 nm.

19. The method according to claim 2, further comprising the steps of:

filling in cracks between tile portions by depositing a layer of an opaque material over the tile portions and the grid lines; and etching the opaque material.

20. The method according to claim 19, wherein the layer of opaque material is a conformal layer, the opaque material is a metal, and the metal is etched anisotropically.

21. The method according to claim 1, wherein the mask film is a thin chromium film.

22. The method according to claim 1, wherein the interfering beams of radiation create a cartesian coordinate grid of dividing lines.

23. The method according to claim 2, wherein the selective removal of the at least one tile portion of the mask film includes the steps of:

exposing at least one portion of the layer of photoresist over at least one tile portion to be removed;

developing the photoresist; and etching the mask film to remove the at least one tile.

24. The method according to claim 1, wherein the grid lines are formed parallel to two perpendicular axes.

25. The method according to claim 24, wherein grid lines parallel to one of the axes are defined sequentially with grid lines parallel to the other of the axes.

26. A microlithography mask made by a method comprising the step of:

utilizing at least two interfering beams of radiation to define a grid of dividing lines corresponding to an interference pattern produced by the interfering beams on a surface of a photolithography mask coated with a mask film.

27. A method for manufacturing a photolithography mask, the method comprising the step of:

utilizing conventional photolithography techniques to define a grid of dividing lines corresponding to an interference pattern produced by at least two interfering beams of radiation on a surface of a master photolithography mask coated with a film of a masking material.

28. The method according to claim 27, further comprising the step of:

developing the photoresist to expose masking material underlying the grid of lines;

etching the masking material exposed by developing the photoresist;

removing the remaining photoresist, thereby forming a master photolithography mask; and utilizing the master photolithography mask, a reduction stepper and conventional photolithography techniques to define a grid of dividing lines corresponding to an interference pattern produced by the interfering beams on a surface of a second photolithography mask coated with a film of a masking material.

29. The method according to claim 28, wherein the grid lines are formed parallel to two perpendicular axes.

30. The method according to claim 29, wherein grid lines parallel to one of the axes are defined sequentially with grid lines parallel to the other of the axes.

* * * * *